(12) United States Patent
Raj

(10) Patent No.: US 11,330,673 B2
(45) Date of Patent: May 10, 2022

(54) HEATED SUBSTRATE SUPPORT

(71) Applicant: Applied Materials, Inc., Santa Clara, CA (US)

(72) Inventor: Govinda Raj, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 502 days.

(21) Appl. No.: 16/189,810

(22) Filed: Nov. 13, 2018

(65) Prior Publication Data

US 2019/0159292 A1 May 23, 2019

Related U.S. Application Data

(60) Provisional application No. 62/588,776, filed on Nov. 20, 2017.

(51) Int. Cl.
| | |
|---|---|
| *H05B 3/14* | (2006.01) |
| *H01L 21/67* | (2006.01) |
| *H05B 1/02* | (2006.01) |
| *H01L 21/687* | (2006.01) |

(52) U.S. Cl.
CPC ....... *H05B 3/143* (2013.01); *H01L 21/67098* (2013.01); *H01L 21/67103* (2013.01); *H01L 21/67109* (2013.01); *H01L 21/67248* (2013.01); *H01L 21/68792* (2013.01); *H05B 1/0233* (2013.01)

(58) Field of Classification Search
CPC .. B64C 1/067; B64C 1/14; B64C 1/40; B64C 1/403; H01L 21/67098; H01L 21/67103; H05B 3/143; H05B 1/0233
See application file for complete search history.

(56) References Cited

U.S. PATENT DOCUMENTS

| | | | |
|---|---|---|---|
| 4,469,757 A | 9/1984 | Ghosh et al. | |
| 5,087,297 A | 2/1992 | Pouliquen | |
| 5,476,548 A | 12/1995 | Lei et al. | |
| 5,688,331 A * | 11/1997 | Aruga | C23C 16/45521 |
| | | | 118/725 |
| 6,143,078 A | 11/2000 | Ishikawa et al. | |

(Continued)

FOREIGN PATENT DOCUMENTS

| | | |
|---|---|---|
| JP | 2003/100851 A | 4/2003 |
| JP | 2006/049568 A | 2/2006 |

(Continued)

OTHER PUBLICATIONS

Korean Office Action dated Feb. 26, 2020 for Application No. 10-2018-0142766.

(Continued)

*Primary Examiner* — Justin C Dodson
*Assistant Examiner* — Dilnessa B Belay
(74) *Attorney, Agent, or Firm* — Patterson + Sheridan, LLP

(57) ABSTRACT

A heater for a semiconductor processing chamber is disclosed that includes a ceramic body, and a resistive heating element embedded in the ceramic body, the resistive heating element disposed in a heater coil having an inner central sector and an outer central sector, the inner central sector having a plurality of first peaks and the outer central sector having a plurality of second peaks, wherein the number of first peaks is less than about fifty-six, and the number of second peaks is less than about eighty.

19 Claims, 8 Drawing Sheets

(56) References Cited

U.S. PATENT DOCUMENTS

| | | |
|---|---|---|
| 6,189,482 B1 | 2/2001 | Zhao et al. |
| 6,231,671 B1 | 5/2001 | Ciliske et al. |
| 6,464,790 B1 | 10/2002 | Sherstinsky et al. |
| 7,048,814 B2 | 5/2006 | Lin et al. |
| 7,189,946 B2 | 3/2007 | Goto et al. |
| 9,917,001 B2 | 3/2018 | Desai et al. |
| 2003/0003281 A1 | 1/2003 | Catteau et al. |
| 2004/0117977 A1 | 6/2004 | Hiramatsu et al. |
| 2004/0221959 A1 | 11/2004 | Choi et al. |
| 2005/0082274 A1 | 4/2005 | Kondou et al. |
| 2005/0118450 A1 | 6/2005 | Fujii et al. |
| 2005/0173411 A1* | 8/2005 | Goto ................ H05B 3/748 219/543 |
| 2005/0258160 A1* | 11/2005 | Goto ............ H01L 21/67103 219/270 |
| 2006/0075970 A1 | 4/2006 | Guenther et al. |
| 2006/0081601 A1 | 4/2006 | Futakuchiya et al. |
| 2006/0096972 A1* | 5/2006 | Nakamura ...... H01L 21/67103 219/444.1 |
| 2007/0090516 A1* | 4/2007 | White ............... C23C 16/4586 257/704 |
| 2014/0165915 A1* | 6/2014 | Raj ................ H01L 21/68792 118/725 |
| 2014/0291311 A1 | 10/2014 | Cho et al. |
| 2015/0173127 A1* | 6/2015 | Kim .................... H05B 3/16 219/540 |
| 2015/0380220 A1 | 12/2015 | Tan et al. |

FOREIGN PATENT DOCUMENTS

| | | |
|---|---|---|
| JP | 2009256789 A | 11/2009 |
| KR | 10-2009-0054785 A | 6/2009 |
| KR | 20130128939 A | 11/2013 |
| WO | 2003/066920 A1 | 8/2003 |

OTHER PUBLICATIONS

"High-Temperature Dielectric Properties of Aluminum Nitride Ceramic for Wireless Passive Sensing Applications", J. Liu et al., Sensors 15, 22660 (2015).

Taiwain Office Action dated May 21, 2019 for Application No. 107141164.

* cited by examiner

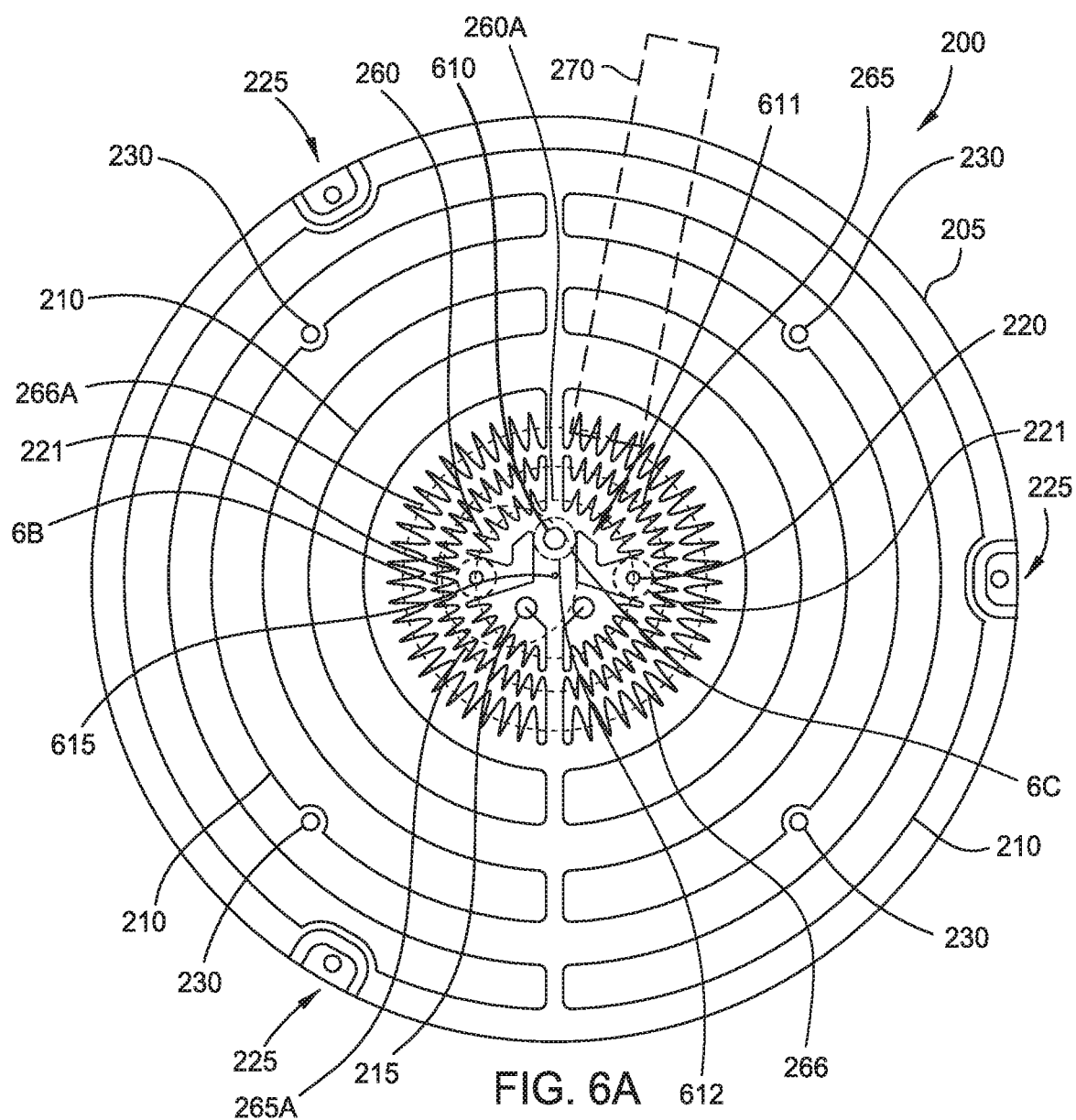

HEATED SUBSTRATE SUPPORT

CROSS-REFERENCE TO RELATED APPLICATION

This application claims benefit of U.S. Provisional Patent Application Ser. No. 62/588,776, filed Nov. 20, 2017, which is hereby incorporated by reference herein.

BACKGROUND

Field

Embodiments of the disclosure generally relate to heated substrate supports utilized in the manufacture of electronic devices on substrates, such as semiconductor substrates.

Description of the Related Art

Ceramic substrate heaters may be advantageously used in the presence of plasma and corrosive plasma species, such as chlorine-containing species found in a plasma-enhanced chemical vapor deposition (PECVD) process and associated cleaning processes. Ceramic heaters typically have an electric heating element within a ceramic heater body, which protects the heating element from the corrosive environment of the deposition chamber while transmitting heat from the heating element to the substrate. Typically harder and more brittle than metals, ceramic materials may be difficult to machine, thereby requiring a simple mechanical design. Being somewhat brittle, ceramic may fracture from crack growth and propagation if repeatedly subjected to a sufficient and/or varying thermal gradient. Cracking may also arise from the differences in thermal expansion found at the transition from the ceramic heater assembly to a material with a different thermal expansion coefficient.

Moreover, temperature uniformity is an important consideration in most semiconductor substrate manufacturing processes, and as a result, substrate heaters have been developed to provide greater control over the thermal characteristics of the substrate heater in a thermal processing system, such as a CVD system. Even slight variations in temperature uniformity across a substrate, on the order of just a few degrees Celsius, can adversely affect a CVD process. Limitations in manufacturing tolerances make it extremely difficult to make a substrate heater that has consistent thermal characteristics along its entire surface area. In addition, heat loss will vary from the center to the edge of a substrate supporting portion of the substrate heater. In general, more heat will be lost at the edges versus the center of the substrate supporting portion of the substrate heater. However, in cases where the substrate supporting portion of a substrate support is support by a cooled center shaft, the center region of the substrate supporting portion is typically relatively cooler than the edges of the substrate supporting portion at moderate processing temperatures. The undesirable difference in the center temperature versus the edge temperature is often due to the ability of the cooled supporting center shaft to conduct heat away from the center of the heater versus the unsupported edge region of the substrate support.

Therefore, what is needed is a heated substrate support having improved temperature uniformity across the substrate supporting surface.

SUMMARY

In one embodiment, a substrate heater for a semiconductor processing chamber is provided, the heater including a circular ceramic body having an outer diameter, a plurality of purge openings disposed in the ceramic body, and a resistive heating element embedded in the ceramic body. The resistive heating element is disposed in a heater coil pattern having an outer sector, a primary ring, and a secondary ring. The primary ring includes a first conductive element that has a plurality of first peaks, the height of the first peak is about 2% to about 4% of the outer diameter of the circular ceramic body. The secondary ring includes a second conductive element that has a plurality of second peaks, wherein the number of second peaks greater than the number of first peaks, and the height of the second peak is about 2% to about 4% of the outer diameter of the circular ceramic body.

In another embodiment, a substrate heater for a semiconductor processing chamber is provided, the heater including a circular ceramic body having an outer diameter, a plurality of purge openings disposed in the ceramic body, and a resistive heating element embedded in the ceramic body. The resistive heating element is disposed in a heater coil pattern having an outer sector, a primary ring, and a secondary ring. The primary ring includes a first conductive element that has a plurality of first peaks, wherein the number of first peaks is less than about fifty-six, the height of the first peak is about 2% to about 4% of the outer diameter of the circular ceramic body, and the average diameter of the primary ring is from about 15% to about 19% of the outer diameter of the circular ceramic body. The secondary ring includes a second conductive element that has a plurality of second peaks, wherein the number of second peaks is less than about eighty, the height of the second peak is about 2% to about 4% of the outer diameter of the circular ceramic body, and the average diameter of the secondary ring is from about 22% to about 26% of the outer diameter of the circular ceramic body.

The high density of heating elements at the center of the heater provides for a more even heat flow, as the shaft provides an avenue for unwanted heat flow from the heater.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6A is a sectional plan view of a heated substrate support showing another embodiment of a heater coil.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure herein include an apparatus used to provide enhanced temperature uniformity across a substrate supporting surface of a substrate heater. In some embodiments, a heated substrate support includes a resistive coil that improves thermal uniformity from a typical 3% non-uniformity at 400 degrees Celsius to about 1% non-uniformity at 400 degrees Celsius. The heated substrate support may be utilized in vacuum processing chambers available from Applied Materials, Inc., of Santa Clara, Calif., as well as vacuum processing chamber available from other manufacturers. The resistive coil provides a high thermal energy density near the center of the heater, where the supporting shaft meets the substrate supporting element of the substrate heater. Embodiments of the disclosure provided herein may be especially useful for, but are not limited to, improving the temperature uniformity across a substrate supporting surface on the substrate supporting element of a substrate heater.

Figure 1A:
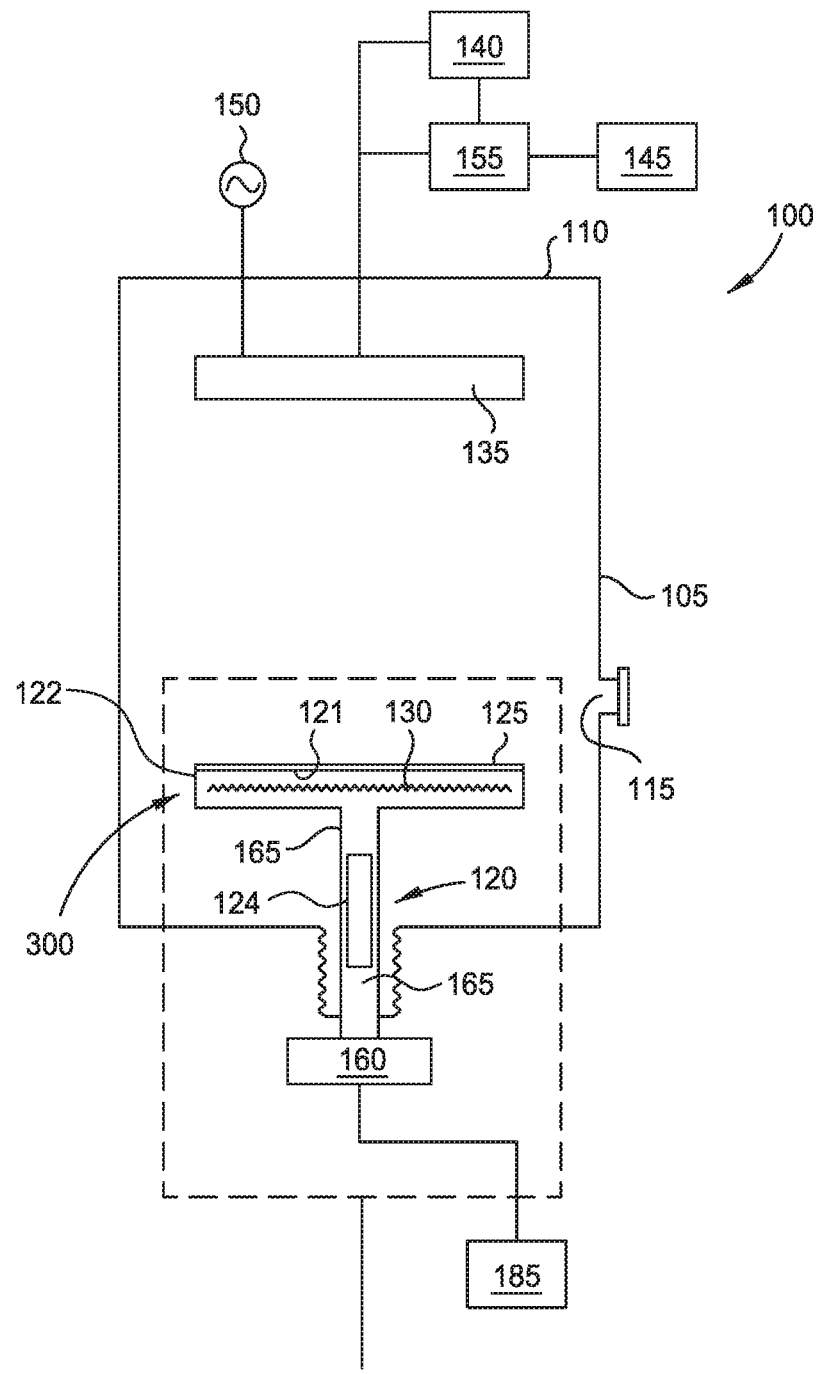
FIG. 1A is a schematic side cross-sectional view of a vacuum processing chamber having a heated substrate support, according to one embodiment.

FIG. 1A is schematic side cross-sectional view of a vacuum processing chamber 100 according to one embodiment. The chamber 100 includes a chamber body 105 and a lid 110. The chamber body 105 includes a transfer port 115 that is sized to allow a substrate to pass therethrough on a robot blade or end effector. The chamber 100 includes a heated substrate support 120 that supports a substrate 125 on a substrate supporting surface 121 of a substrate supporting element 122 of the heated substrate support. The heated substrate support 120 may be made of a high thermal conductivity ceramic material, according to one embodiment. The heated substrate support 120 comprises aluminum (Al) and nitrogen (N), according to one embodiment. The material of the heated substrate support 120 has a thermal conductivity of about 170 to about 220 W/m·K, according to one embodiment. The heated substrate support 120 includes a heating coil 130 embedded in the substrate supporting element 122. The substrate supporting element 122 is supported by a centrally located support shaft 165. In some embodiments, the substrate supporting element 122 includes a ceramic material containing body that is supported by the support shaft 165 that is also formed from a ceramic material. The support shaft 165 is supported by the chamber body 105, and the shaft is cooled by a temperature controlling device 124 that is formed within or attached to the support shaft.

The chamber 100 also includes a gas distribution showerhead 135. The gas distribution showerhead 135 is coupled to a precursor gas supply 140 and a cleaning gas supply 145. The precursor gas supply 140 may include gases for forming films on the substrate 125. The precursor gas supply 140 includes tungsten (W), such as tungsten hexafluoride (WF$_6$), according to one embodiment. The gas distribution showerhead 135 is coupled to a power supply 150 that may be used to bias the gas distribution showerhead 135 relative to the heated substrate support 120 to form a plasma that includes the precursor gases. The cleaning gas supply 145 includes cleaning gases such as ammonia (NH$_3$), fluorine (F), or any combination of the above. The cleaning gas(es) may be flowed through a remote plasma source 155 to form radicals, such as F or NH radicals, that are flowed through the gas distribution showerhead 135 in order to clean chamber components, such as the heated substrate support 120. The substrate supporting element 122 of the heated substrate support 120 is coupled to a lift mechanism 160 via the shaft 165 that is configured to raise and lower the heated substrate support relative to the gas distribution showerhead 135. The lift mechanism 160 is connected to an actuator 185 that causes the heated substrate support 120 to be raised and lowered.

Figure 1B:
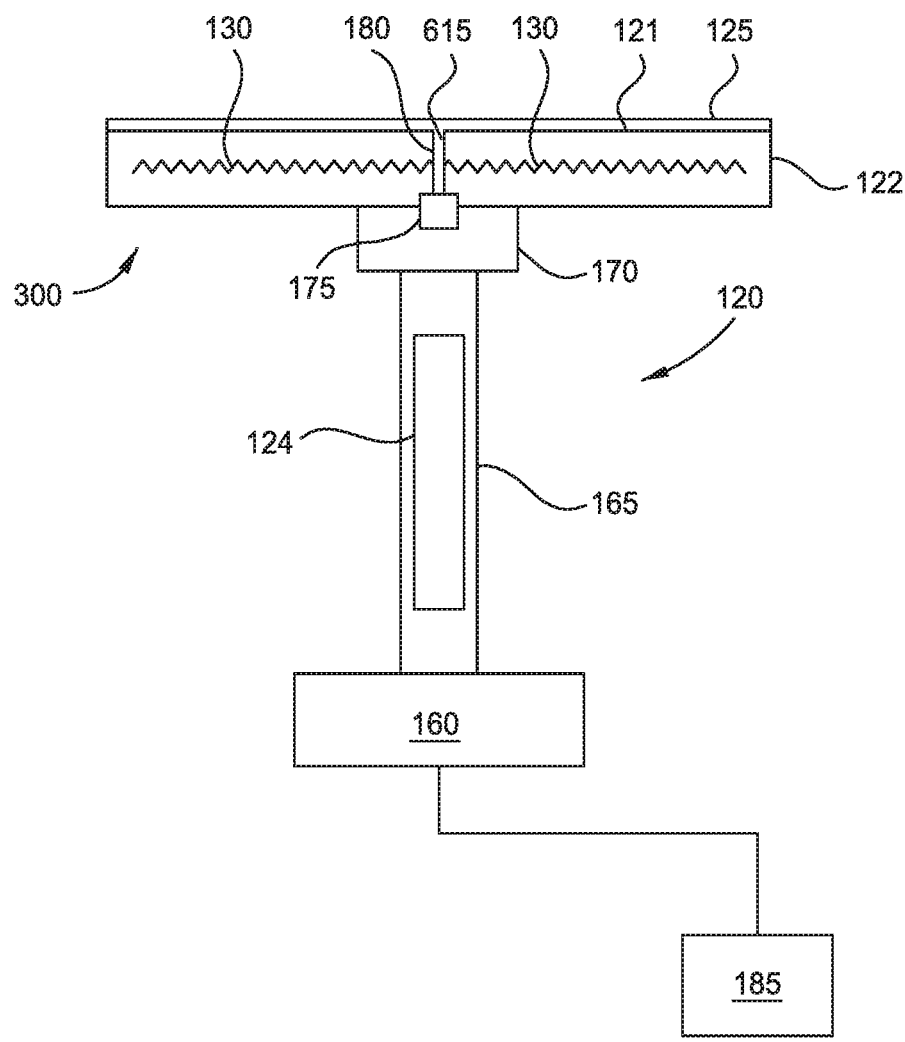
FIG. 1B is a schematic side view of the heated substrate support, illustrated in FIG. 1A.

FIG. 1B is a zoomed in schematic side view of the heated substrate support 120, according to one embodiment. In one embodiment, the shaft 165 is directly coupled to the substrate supporting element 122 of the heated substrate support 120. In another embodiment, the shaft 165 is coupled to a thermal support 170, which is coupled to the heated substrate support 120. The material from which the shaft 165 is made may include aluminum (Al) and nitrogen (N). The support shaft 165 is supported by the chamber body 105. The support shaft 165 is cooled by a temperature controlling device 124 that is formed within or attached to the support shaft. The material of the shaft 165 has a thermal conductivity of about 70 W/m·K, according to one embodiment.

A gas supply 175 is disposed between the thermal support 170 and the substrate supporting element 122 of the heated substrate support 120, according to one embodiment. The gas supply 175 is coupled to an outside source (not pictured) to supply gas to the gas supply 175. A gas channel 180 supplies gas from the gas supply 175 to the substrate 125. The gas can be used as a backside gas when the substrate 125 is disposed on the surface 121 of the heated substrate support 120. The backside gas improves conductive heat transfer between the heater 300 and the substrate 125.

Figure 2A:
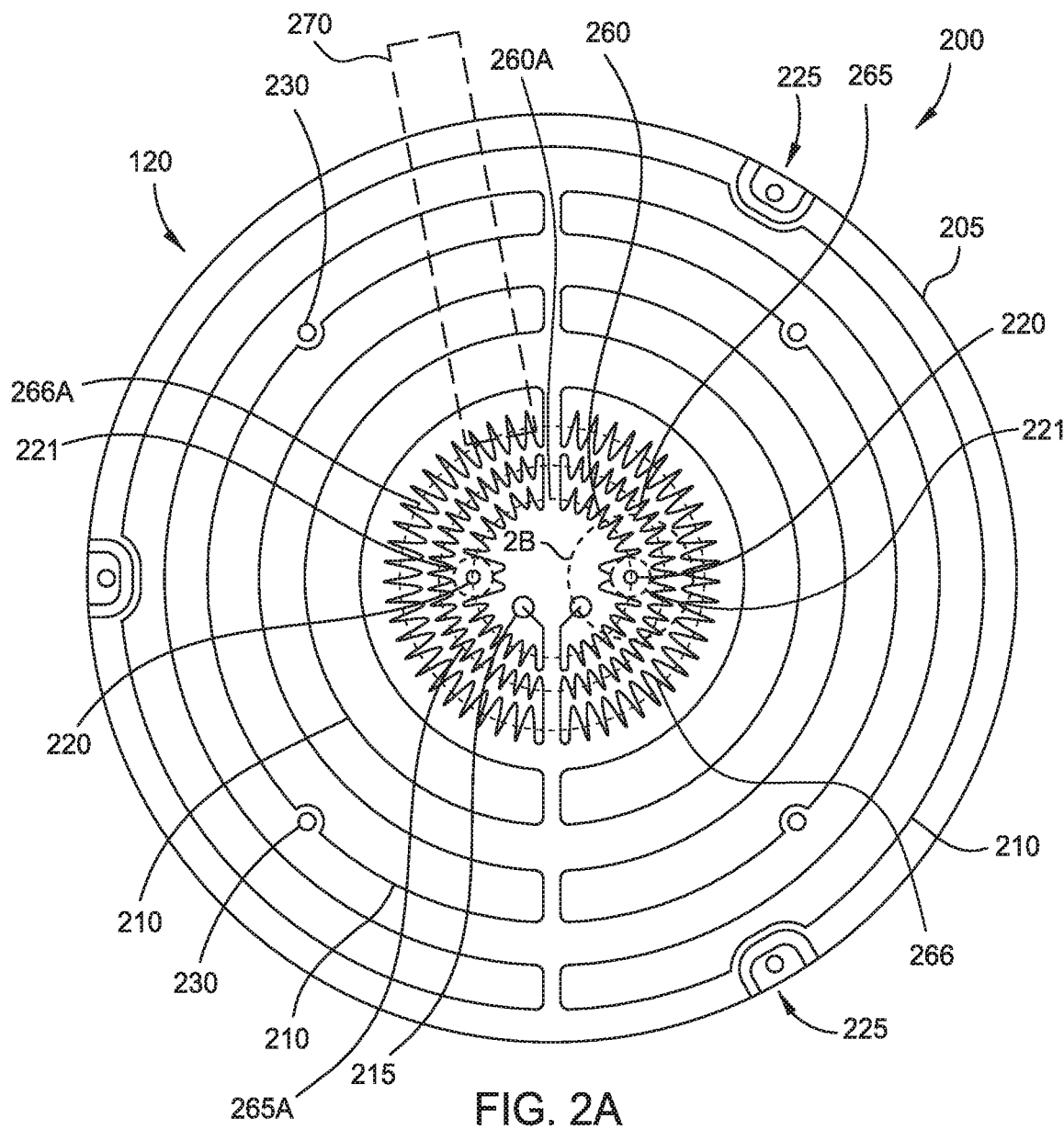
FIG. 2A is a sectional plan view of the heated substrate support of FIG. 1A showing one embodiment of a heater coil.

FIG. 2A is a sectional plan view of the substrate supporting element 122 of the heated substrate support 120 of FIG. 1 showing one embodiment of a heater coil pattern 200 disposed within the substrate supporting element 122. The heater coil pattern 200 may be utilized as the heating coil 130 of the heated substrate support 120 of FIG. 1. The heater coil pattern 200 is formed within the substrate supporting element 122. In some embodiments, as shown in FIG. 2A, the substrate supporting element 122 includes a ceramic body 205 which has a resistive heating element 210 formed therein. In some embodiments, the ceramic body 205 has a circular shape.

The heater coil pattern 200 includes the resistive heating element 210, which includes an electrically conductive wire (e.g., nickel-chrome wire), conductive cable or patterned layer of metal (e.g., tungsten (W)) that is formed in a specified heat generating pattern. The resistive heating element 210 can supply a current from about 1 mA to about 30 A, preferably between about 1 mA to about 10 A. The resistive heating element 210 consumes from about 1 kW to about 6 kW. The resistive heating element 210 has a resistance of about 1 mΩ to about 3Ω. In the example, which is depicted in FIG. 2A, the resistive heating element 210 is a single resistive heating wire. The resistive heating element 210 is coupled to a power source (not shown) via connection interfaces 215. The connection interfaces 215 may be formed or provided near a center of the ceramic body 205. The resistive heating elements comprise an outer sector 270, a tertiary ring 266, a secondary ring 265, and a primary ring 260. In one example, as shown, the outer sector 270 comprises about six rings.

Figure 2B:
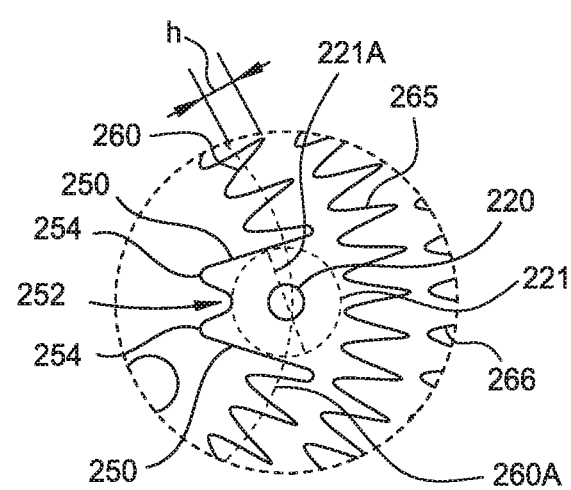
FIG. 2B is an enlarged view showing details of the heater coil of FIG. 2A around one of the plurality of purge openings, according to one embodiment.

The primary ring 260 has an average diameter 260A. The primary ring 260 comprises a first conductive element, wherein the first conductive element includes a plurality of first peaks that extend on either side of the average diameter 260A. The average diameter 260A is about 15 percent to about 19 percent of the outer diameter, and preferably about 16 percent to about 18 percent of the outer diameter. In some embodiments, the number of first peaks is less than about fifty-six. The height "h" of the first peak is about 1 percent to about 3 percent of the diameter of the ceramic body 205, wherein the height "h" of the first peak is measured with respect to the average diameter 260A, as shown in FIG. 2B. In general, the height "h" of the various peaks within a ring (e.g., tertiary ring 266, secondary ring 265, or primary ring 260) are measured from their respective average diameter to the tip of a related peak, as shown in FIG. 2B.

The secondary ring 265 has an average diameter 265A. The secondary ring 265 comprises a second conductive element, wherein the second conductive element includes a plurality of second peaks that extend on either side of the average diameter 265A. The average diameter 265A is about 22 percent to about 26 percent of the outer diameter, and preferably about 23 percent to about 25 percent of the outer diameter. In some embodiments, the number of second peaks is less than about eighty. The height "h" of the second peak is about 1% to about 3% of the diameter of the ceramic body 205, wherein the height "h" of the second peak is measured with respect to the average diameter 265A.

The tertiary ring 266 comprises a third conductive element, wherein the third conductive element includes a plurality of third peaks that extend on either side of the average diameter 266A. The average diameter 266A is about 30 percent to about 34 percent of the outer diameter, and preferably about 31 percent to about 33 percent of the outer diameter. In some embodiments, the number of third peaks is less than about one hundred. The height "h" of the third peak is about 2% to about 4% of the diameter of the ceramic body 205, wherein the height "h" of the third peak is measured with respect to the average diameter 266A. The number of peaks and their arrangement in nested rings allows for a higher density of heating element 210, compensating for the heat loss due to the temperature controlled shaft 165 at the center of the heater 300.

In one example, the substrate support 120 has an outer diameter of about 305 mm, the average diameter 260A of the primary ring 260 is from about 49 mm to about 55 mm, the height "h" of the first peak is from about 3 to about 9 mm, the average diameter 265A of the secondary ring 265 is from about 70 mm to about 76 mm, the height "h" of the second peak is from about 3 mm to about 9 mm, the average diameter 266A of the tertiary ring 266 is from about 94 mm to about 101 mm, and the height "h" of the third peak is from about 6 to about 12 mm.

In another example, the substrate support 120 has an outer diameter of about 230 mm, the average diameter 260A of the primary ring 260 is from about 37 mm to about 41 mm, the height "h" of the first peak is from about 2 mm to about 7 mm, the average diameter 265A of the secondary ring 265 is from about 53 mm to about 58 mm, the height "h" of the second peak is from about 2 mm to about 7 mm, the average diameter 266A of the tertiary ring 266 is from about 71 mm to about 76 mm, and the height "h" of the third peak is from about 5 to about 9 mm.

While not intending to limiting, in some embodiments, the tertiary ring 266, the secondary ring 265, and the primary ring 260 are electrically connected in series. In some embodiments, as illustrated in FIGS. 2A, 4A, 5A and 6A, a first portion of the tertiary ring 266 is connected in series with a first portion of the secondary ring 265, and the first portion of the secondary ring 265 is connected in series with a first portion of the primary ring 260, and the first portion of the primary ring 260 is in electrical communication with a second portion of the primary ring 260 that is connected in series with a second portion of the secondary ring 265, which is connected in series with a second portion of the of the tertiary ring 266. The first and second portions of the rings 260, 265, 266 can be configured to extend a distance that is between about a quarter and about a half (e.g., illustrated in FIGS. 2A, 4A, 5A and 6A) of the circumference of their respective average ring diameters 260A, 265A, 266A. In one configuration (not shown), the first portion of the primary ring 260 and the second portion of the primary ring 260 may form one continuous ring that is connected to the first and second portions of the secondary ring 265 at either end of the formed continuous ring. While not shown, in some alternate embodiments, the tertiary ring 266, the secondary ring 265, and/or the primary ring 260 are electrically connected in parallel to a power source or separately connected to separate power sources.

Spacers 225 are provided on a perimeter of the ceramic body 205. The spacers 225 may be utilized to support a ring (not shown) during processing. Lift pin openings 230 are also formed through the ceramic body 205. The lift pin openings 230 may be utilized to house lift pins utilized in substrate transfer. In order to provide uniform heating, a pattern of the heating element 210 is required that will increase heating element density per area while still having the heating element avoid the lift pin openings 230 and the spacers 225. This pattern is shown in FIGS. 2A, 4A, 5A, and 6A.

Purge openings 220 are shown near the center which may be used for introduction of a backside gas or purge routed through passages (not shown) formed through the body 205. The purge openings 220 located at the center of the heater 300 are connected by a gas channel 180 to a gas supply 175. The gas supply 175 is coupled to an outside source (not pictured) to supply gas to the gas supply, which then provides gas through the purge openings 200 to the substrate 125. The resistive heating element 210 is coupled to a power source (not shown) via connection interfaces 215. In order to provide uniform heating, a pattern of the heating element 210 is required that will increase heating element density per unit area while still having the heating element avoid the purge openings 220 and connection interfaces 215. This pattern is described in more detail in the figures that follow (FIGS. 2B, 4B, 5B, 6B).

FIG. 2B is an enlarged view showing details of the heater coil pattern 200 around one of the plurality of purge openings 220. The primary ring 260 adjacent to the purge openings 220 includes a pair of first segments 250 surrounding a purge opening, according to one embodiment. The first segments 250 may have a radial orientation, be parallel, or form a radially outward facing acute angle there between. The first segments 250 transition to a depressed portion 252 surrounded by a pair of protruding portions 254. The depressed portions 252 may be depressed in a radially inward direction, and extend radially away from the center of the ceramic body 205 toward the purge opening 220. A circular exclusion zone 221 is formed around each purge opening 220, such that no portion of the heater coil pattern 200 enters the exclusion zone. The exclusion zone 221 has an exclusion diameter 221A of from about 3 percent to about 5 percent of the outer diameter. The pair of first segments 250, the depressed portion 252, and the pair of protruding portions 254 allow for a large density of heating elements at the center of the ceramic body 205, while still avoiding the purge openings 220.

In one example, the substrate support 120 has an outer diameter of about 305 mm, and the exclusion diameter 221A is from about 9 mm to about 15 mm. In another example, the substrate support 120 has an outer diameter of about 230 mm, and the exclusion diameter 221A is from about 7 mm to about 12 mm.

Figure 3A:
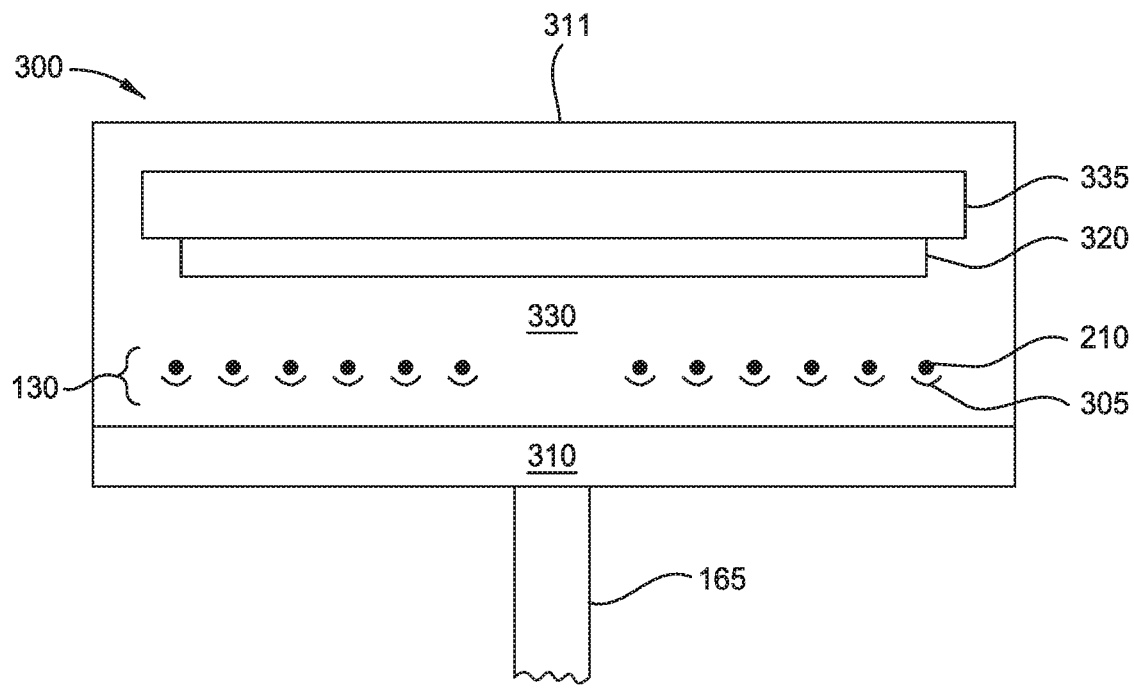
FIG. 3A is a schematic side sectional view of a heated substrate support, according to one embodiment.

FIG. 3A is a schematic side cross-sectional view of another embodiment of a heater 300, which may be used as the heated substrate support 120 of FIG. 1. The heater 300 includes a ceramic body 205 having the resistive heating element 210 embedded therein. The resistive heating element 210 may be provided in a specific coil pattern, such as the heater coils as described herein above in FIGS. 2A-B, and below in FIGS. 4A-B, 5A-B, and 6A-B. In this embodiment, the heater 300 includes a thermal barrier 305 disposed about or on the resistive heating element 210. The thermal barrier 305 may substantially surround the resistive heating element 210 with the exception of a portion that faces a substrate receiving surface 311 of the ceramic body 205. For example, the thermal barrier 305 may envelop up to about 50% to about 75% of the outer dimension of the resistive heating element 210 while the remaining portion of the resistive heating element 210 is not coated, covered (with the exception of the ceramic body 205) or enclosed by the thermal barrier 305. The thermal barrier 305 comprises zirconium (Zr) and oxygen (O), according to one embodiment. The thermal barrier 305 has a thickness of less than about 100 microns, according to one embodiment.

The heater 300 further comprises a thermal barrier coating 310, according to one embodiment. The heater 300 further comprises a primary grounding material 320, according to one embodiment. The primary grounding material 320 is a mesh, according to one embodiment. The primary grounding material 320 includes molybdenum (Mo), according to one embodiment. The primary grounding material 320 is disposed between the heating coil 130 and the surface of the heater 300. The heater 300 further comprises a secondary grounding material 325, according to one embodiment. The secondary grounding material 325 includes carbon (C), according to one embodiment. The secondary grounding material 325 is a graphite mesh, according to one embodiment. The secondary grounding material 325 is disposed between the primary grounding material 320 and the surface of the heater 300. The primary grounding material 320 and the secondary grounding material 325 provide a ground to the heated substrate support 120 during radio frequency (RF) plasma cleaning.

Figure 3B:
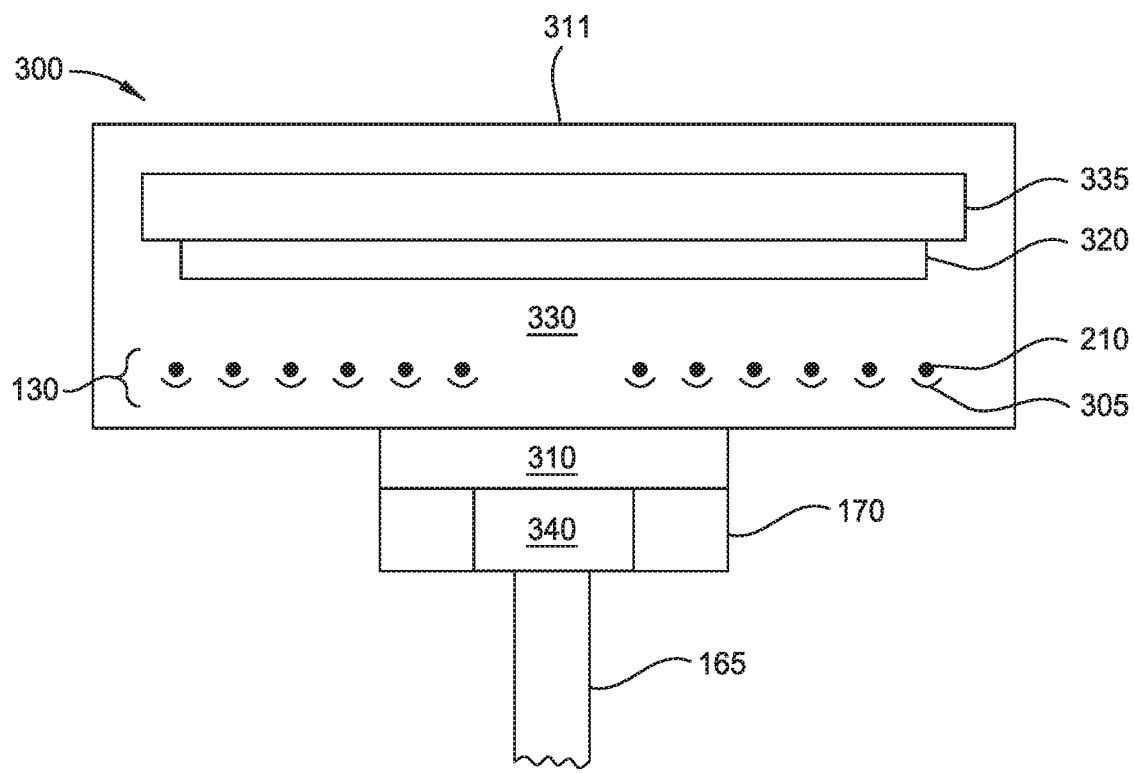
FIG. 3B is a schematic side sectional view of a heated substrate support with thermal barrier coating, according to one embodiment.

FIG. 3B is a schematic side cross-sectional view of another embodiment of a heater 300, which may be used as the heated substrate support 120 of FIG. 1. The heater 300 further comprises a thermal support 170 that is disposed between the shaft 165 and the heater 300. The thermal support 170 further comprises the thermal barrier coating 310, and a low thermal conductivity ceramic 340. The thermal barrier coating 310 is disposed between the heater 300 and the low thermal conductivity ceramic 340. The width of the thermal barrier coating 310 is smaller than the width of the low thermal conductivity ceramic 340, according to one embodiment. The low thermal conductivity ceramic 340 includes Al and N, according to one embodiment. The low thermal conductivity ceramic 340 includes zirconium (Zr) and oxygen (O), according to one embodiment. The low thermal conductivity ceramic 340 includes quartz, according to another embodiment. The low thermal conductivity ceramic 340 may be a ceramic-ceramic or metal-ceramic composite. The thermal support 170 reduces heat loss from the center of the heater 300, which results in a more uniform heating pattern throughout the surface 311 of the heater.

Figure 4A:
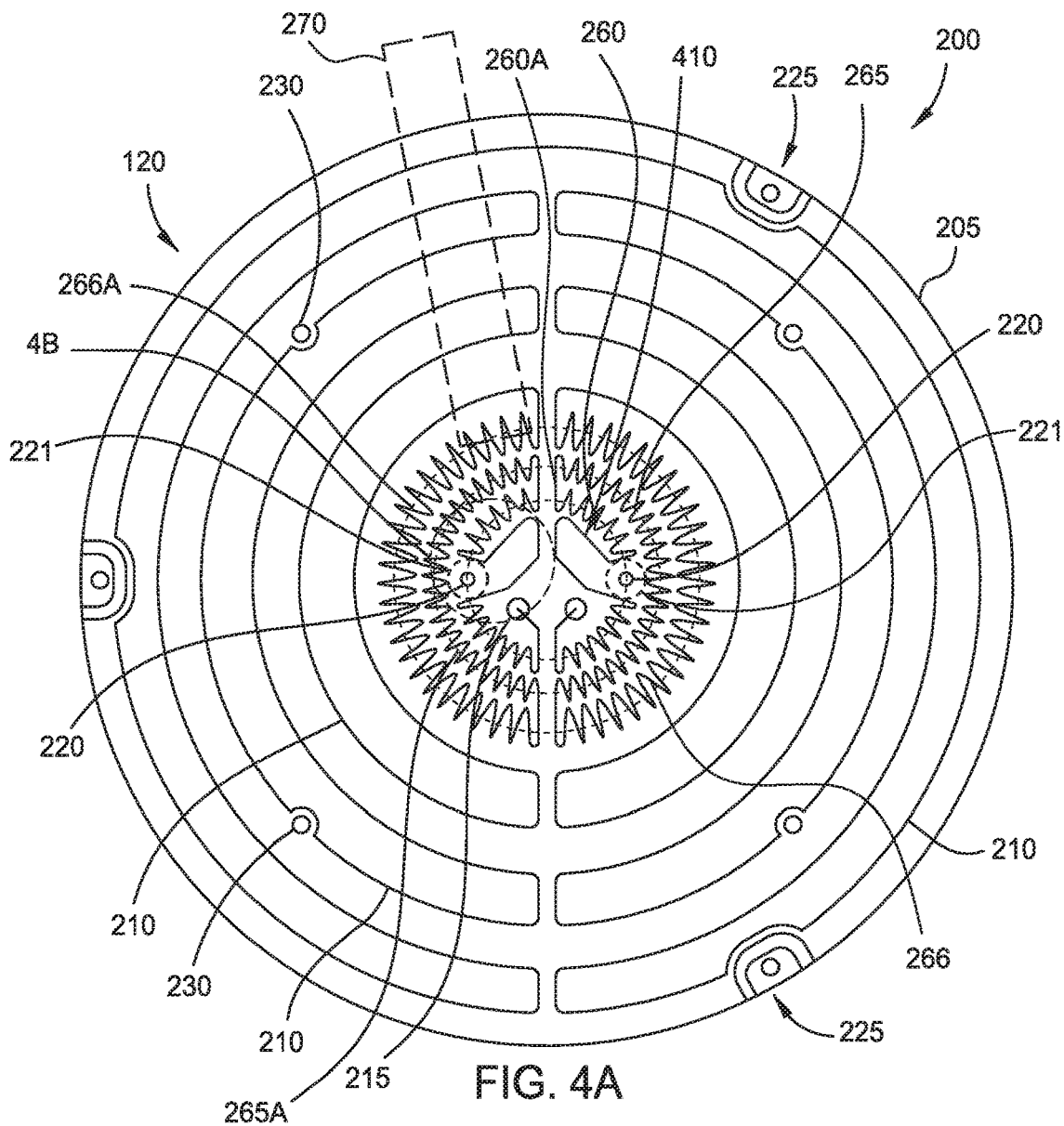
FIG. 4A is a sectional plan view of a heated substrate support showing another embodiment of a heater coil.

FIG. 4A is a sectional plan view of a heated substrate support 120, showing another embodiment of a heater coil pattern 200. The heater coil pattern 200 may be utilized as the heating coil 130 of the heated substrate support 120 of FIG. 1. The heater coil pattern 200 is formed in the ceramic body 205 which would cover a resistive heating element 210. The heated substrate support 120 is similar to the heated substrate support shown in FIG. 2A with the exception of angled wing sections 410 positioned near the center of the ceramic body 205.

Figure 4B:
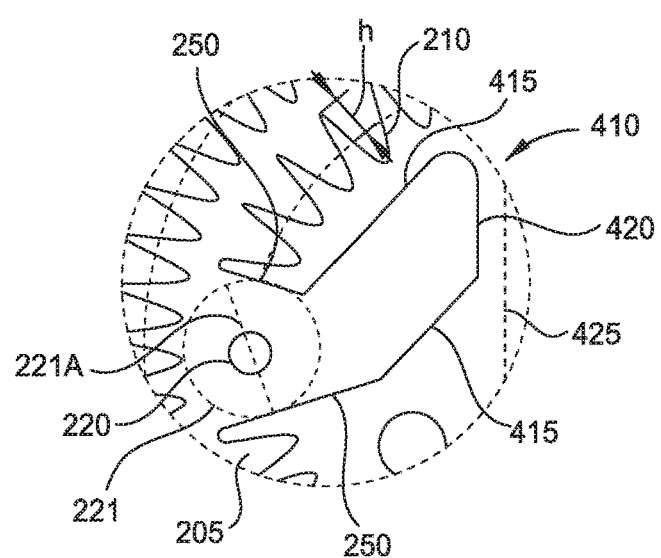
FIG. 4B is an enlarged view showing details of the heater coil of FIG. 4A around one of the plurality of purge openings.

FIG. 4B is an enlarged view showing details of the heater coil pattern 200 around one of the plurality of purge openings 220. The primary ring 260 adjacent to the purge openings 220 comprises the angled wing section 410. The angled wing section 410 comprises a pair of first segments 250, a pair of second segments 415, and a rounded segment 420. The first segments 250 transition to the second segments 415, which are connected by the rounded segment 420. The second segments 415 may be tangentially oriented to an imaginary circle concentric with the center of the ceramic body 205. The first segments 250 may be parallel to each other. The rounded segment 420 may be parallel to a centerline 425 of the ceramic body 205, where the centerline is an imaginary line corresponding to a diameter of the ceramic body 205. The secondary ring 265 and tertiary ring 266 are the same as of FIG. 2A. A circular exclusion zone 221 is formed around each purge opening 220, such that no portion of the heater coil pattern 200 enters the exclusion zone. The exclusion zone 221 has an exclusion diameter 221A of from about 3 percent to about 5 percent of the outer diameter. The pair of first segments 250, the second segment 415, the rounded segment 420 allow for a large density of heating elements at the center of the ceramic body 205, while still avoiding the purge openings 220.

In one example, the substrate support 120 has an outer diameter of about 305 mm, and the exclusion diameter 221A is from about 9 mm to about 15 mm. In another example, the substrate support 120 has an outer diameter of about 230 mm, and the exclusion diameter 221A is from about 7 to about 12 mm.

Figure 5A:
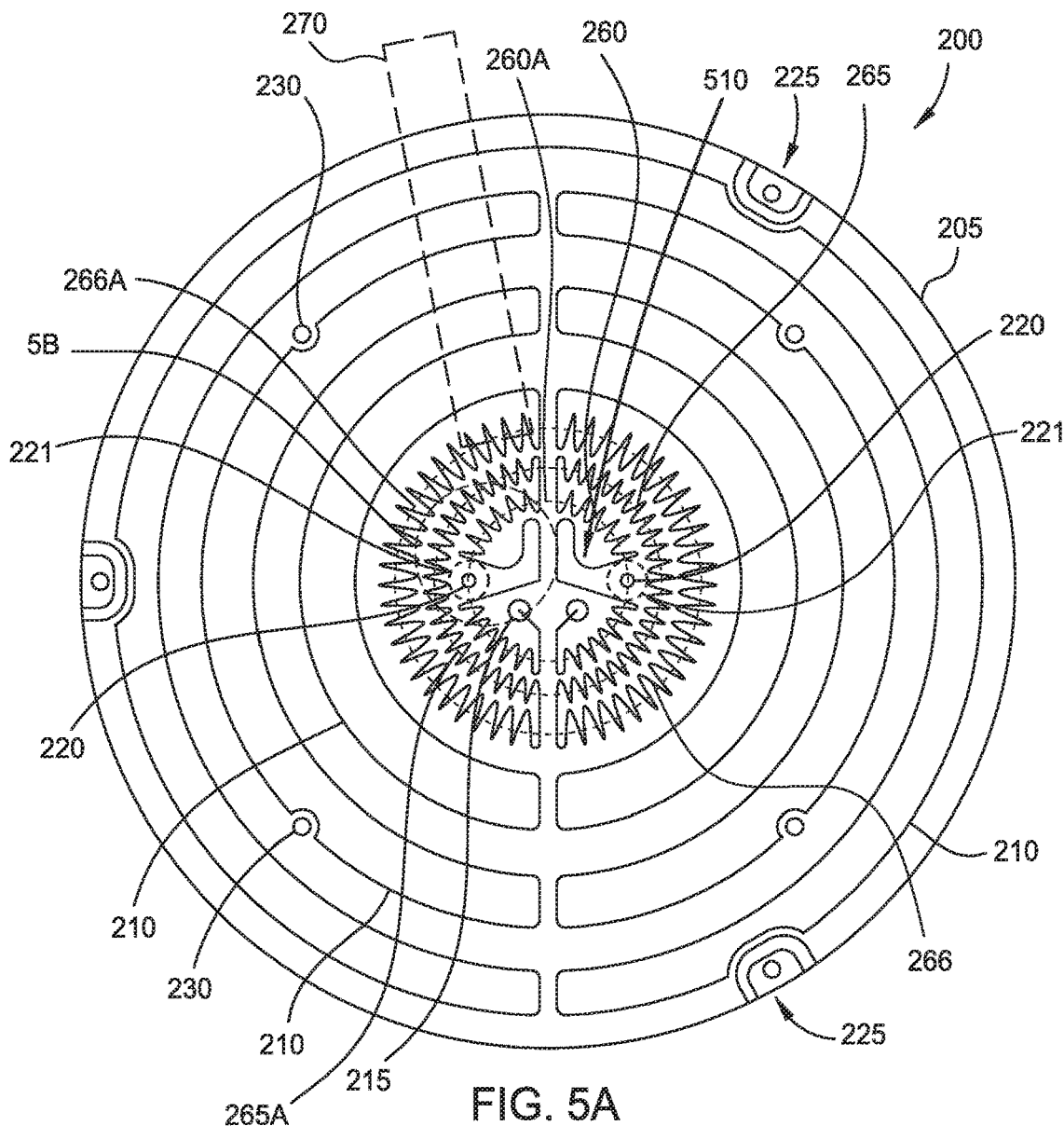
FIG. 5A is a sectional plan view of a heated substrate support showing another embodiment of a heater coil.

FIG. 5A is a sectional plan view of a heated substrate support 120 showing another embodiment of a heater coil pattern 200. The heater coil pattern 200 may be utilized as the heating coil 130 of the heated substrate support 120 of FIG. 1. The heater coil pattern 200 is formed in the ceramic body 205 which would cover a resistive heating element 210. The heated substrate support 120 is similar to the heated substrate support shown in FIG. 2A with the exception of parallel wing sections 510 near the center of the ceramic body 205.

Figure 5B:
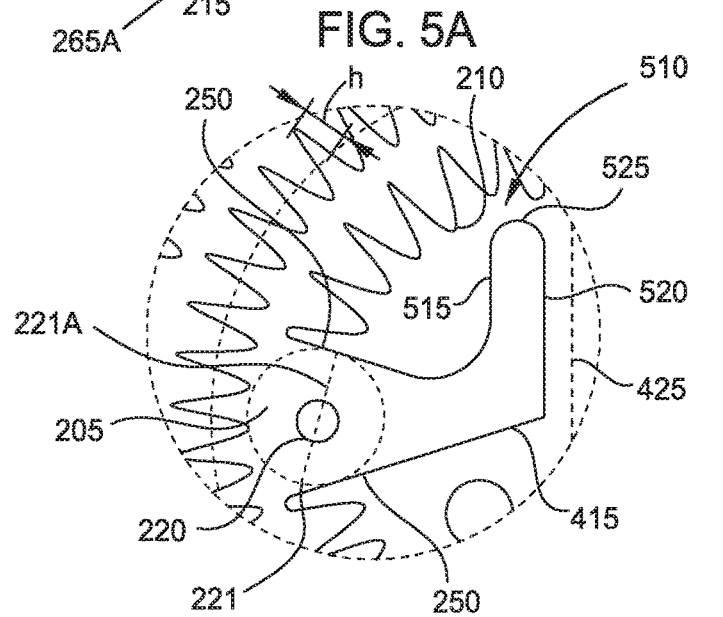
FIG. 5B is an enlarged view showing details of the heater coil of FIG. 5A around one of the plurality of purge openings.

FIG. 5B is an enlarged view showing details of the heater coil pattern 200 around one of the plurality of purge openings 220. The primary ring 260 adjacent to the purge openings 220 comprises a parallel wing section 510. The parallel wing section 510 comprises a pair of first segments 250, a pair of straight segments 515, 520, a rounded segment 525, and a second segment 415. One of the first segments 250 transitions to the second segment 415. The other first segment 250 transitions to the straight segment 515. The straight segment 515 is connected to the straight segment 520 by the rounded segment 525. The straight segment 515 and the straight segment 520 may be oriented parallel to each other. One or both of the straight segments 515, 520 may be oriented parallel to the centerline 425 of the ceramic body 205. The secondary ring 265 and tertiary ring 266 are the same as of FIG. 2A. A circular exclusion zone 221 is formed around each purge opening 220, such that no portion of the heater coil pattern 200 enters the exclusion zone. The exclusion zone 221 has an exclusion diameter 221A of from about 3 to about 5 percent of the outer diameter. The pair of first segments 250, the straight segment 515, the rounded segment 525, the straight segment 520, and the second segment 415 allow for a large density of heating elements at the center of the ceramic body 205, while still avoiding the purge openings 220.

In one example, the substrate support 120 has an outer diameter of about 305 mm, and the exclusion diameter 221A is from about 9 mm to about 15 mm. In another example, the substrate support 120 has an outer diameter of about 230 mm, and the exclusion diameter 221A is from about 7 mm to about 12 mm.

FIG. 6A is a sectional plan view of a heated substrate support 120 showing another embodiment of a heater coil pattern 200. The heater coil pattern 200 may be utilized as the heating coil 130 of the heated substrate support 120 of FIG. 1. The heater coil pattern 200 is formed in the ceramic body 205 which would cover a resistive heating element 210. The heated substrate support 120 is similar to the heated substrate support shown in FIG. 2A with the exception of another purge opening 610 and a center opening 615, and bent wing sections 611.

Figure 6B:
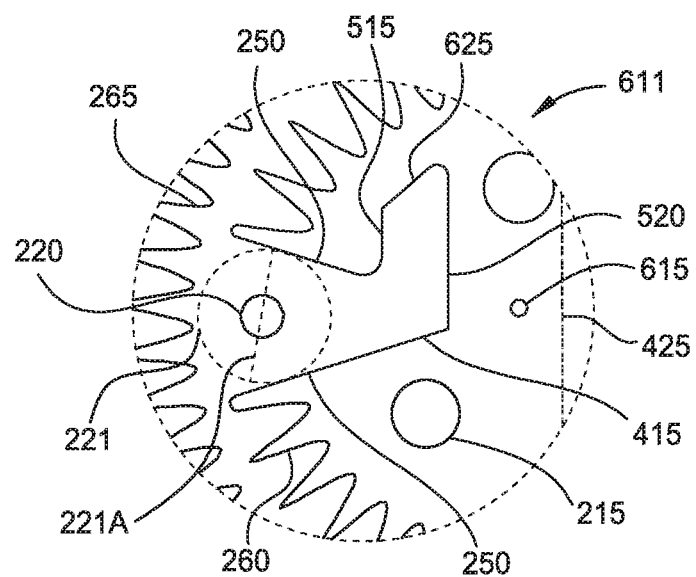
FIG. 6B is an enlarged view showing details of the heater coil of FIG. 6A around one of the plurality of purge openings.

FIG. 6B is an enlarged view showing details of the heater coil pattern 200 around one of the plurality of purge openings 220. The primary ring 260 adjacent to the purge openings 220 comprises a bent wing section 611. The bent wing section 611 comprises a pair of first segments 250, a pair of straight segments 515, 520, a rounded segment 625, and a second segment 415. One of the first segments 250 transitions to the second segment 415. The other first segment 250 transitions to the straight segment 515. The straight segment 515 is connected to the straight segment 520 by the rounded segment 625. The straight segments 515, 520 may be parallel to each other. One or both of the straight segments 515, 520 may be parallel to the centerline 425 of the ceramic body 205. The secondary ring 265 and tertiary ring 266 are the same as of FIG. 2A. A circular exclusion zone 221 is formed around each purge opening 220, such that no portion of the heater coil pattern 200 enters the exclusion zone. The exclusion zone 221 has an exclusion diameter 221A of from about 3 percent to about 5 percent of the outer diameter. The pair of first segments 250, the straight segment 515, the rounded segment 625, the straight segment 520, and the second segment 415 allow for a large density of heating elements at the center of the ceramic body 205, while still avoiding the purge openings 220, the purge opening 610, and the center opening 615.

In one example, the substrate support 120 has an outer diameter of about 305 mm, and the exclusion diameter 221A is from about 9 mm to about 15 mm. In another example, the substrate support 120 has an outer diameter of about 230 mm, and the exclusion diameter 221A is from about 7 to about 12 mm.

Figure 6C:
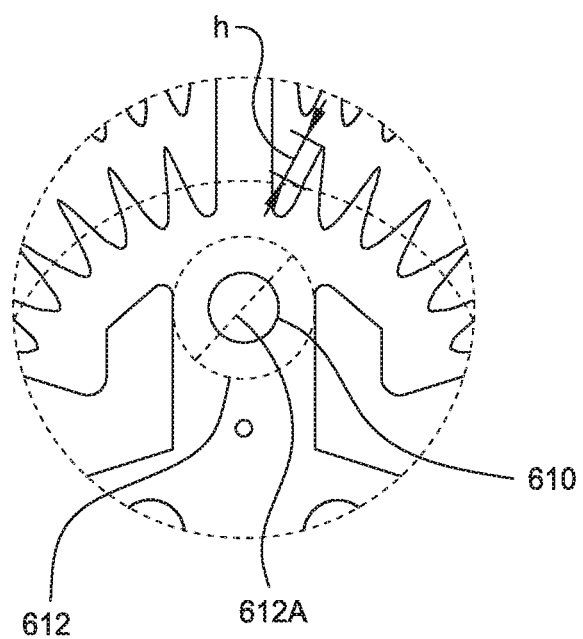
FIG. 6C is an enlarged view showing details of the heater coil of FIG. 6A around another one of the plurality of purge openings.

FIG. 6C is an enlarged view showing details of the heater coil pattern 200 around the purge opening 610. The purge opening 610 is similar to the purge openings 220 and brings the total of purge openings to three, instead of two, as in other embodiments. A circular exclusion zone 612 is formed around the purge opening 610, such that no portion of the heater coil pattern 200 enters the exclusion zone. The exclusion zone 612 has an exclusion diameter 612A of from about 1 percent to about 3 percent of the outer diameter. The center opening 615 may be utilized for grounding a substrate. For example, a rod (not shown) may be positioned in the center opening 615 to contact a backside of the substrate positioned on the substrate receiving surface 311 of the ceramic body 205.

In one example, the substrate support 120 has an outer diameter of about 305 mm, and the exclusion diameter 612A is from about 3 mm to about 9 mm. In another example, the substrate support 120 has an outer diameter of about 230 mm, and the exclusion diameter 612A is from about mm 2 to about 7 mm.

The heater coil pattern 200 comprises the resistive heating element 210, wherein the heating element is separated into a primary ring 260, a secondary ring 265, a tertiary ring 266, and an outer sector 270. The primary ring 260 has additional elements near the center of the heater 300, and the additional elements provide for a high density of heating element 210 per area near the center of the heater, while still avoiding openings 220, 610, and 615. Thermal support 170 reduces heat flow from the center of the heater 300 through the shaft 165.

The high density of heating elements 210 at the center of the heater 300 provides for a more even heat flow, as the shaft 165 provides an avenue for unwanted heat flow from the heater. In addition, thermal support 170 also prevents unwanted heat flow through the shaft 165.

While the foregoing is directed to embodiments of the present disclosure, other and further embodiments of the disclosure may be devised without departing from the basic scope thereof, and the scope thereof is determined by the claims that follow.

The invention claimed is:

1. A substrate heater for a semiconductor processing chamber, the heater comprising:
   a circular ceramic body having an outer diameter;
   a plurality of purge openings disposed in the ceramic body; and
   a resistive heating element embedded in the ceramic body, the resistive heating element disposed in a heater coil pattern, the heater coil pattern comprising:
      an outer sector;
      a primary ring, the primary ring comprising a first conductive element, wherein the first conductive element comprises a plurality of first peaks, a height of the first peak is from 2% to 4% of the outer diameter of the circular ceramic body, wherein at least one of the purge openings is disposed along an average diameter of the primary ring;
a protruding portion extending radially inward from the average diameter of the primary ring, wherein the protrusion portion extends more inwardly than the plurality of first peaks and surrounds at least one of the purge openings, the at least one of the purge openings is disposed radially outward from a peak of the protruding portion; and
a secondary ring, the secondary ring comprising a second conductive element, wherein the second conductive element comprises a plurality of second peaks, a number of second peaks is greater than the number of first peaks, the height of the second peak is 2% to 4% of the outer diameter of the circular ceramic body.

2. The substrate heater of claim 1, wherein the heater further comprises a plurality of circular exclusion zones, wherein each of the exclusion zones of the plurality of exclusion zones is disposed about each purge opening, such that the diameter of each exclusion zone is from 3 percent to 5 percent of the outer diameter.

3. The substrate heater of claim 1, wherein the first conductive element further comprises:
two protruding portions; and
a depressed portion, such that the two protruding portions transition to the depressed portion on either side of the depressed portion.

4. The substrate heater of claim 1, wherein the first conductive element further comprises:
a first segment;
a second segment; and
a rounded segment, wherein the rounded segment connects the first segment to the second segment.

5. The substrate heater of claim 1, further comprising a grounding material.

6. The substrate heater of claim 1, further comprising a tertiary ring, the tertiary ring comprising a third conductive element, wherein the third conductive element comprises a plurality of third peaks, the number of third peaks is less than eighty, and the height of the third peak is 2% to 4% of the outer diameter of the circular ceramic body.

7. The substrate heater of claim 1, wherein the heater is disposed over a shaft, and the shaft is configured to raise and lower the heater.

8. The substrate heater of claim 1, wherein the resistive heating element further comprises a thermal barrier, and the thermal barrier surrounds the resistive heating element.

9. The substrate heater of claim 8, wherein the thermal barrier comprises zirconium and oxygen.

10. The substrate heater of claim 1, wherein the heater comprises aluminum and nitride.

11. A substrate heater for a semiconductor processing chamber, the heater comprising:
a circular ceramic body having an outer diameter;
a plurality of purge openings disposed in the ceramic body; and
a resistive heating element embedded in the ceramic body, the resistive heating element disposed in a heater coil pattern, the heater coil pattern comprising:
an outer sector;
a primary ring, the primary ring comprising:
a first conductive element, wherein the first conductive element comprises a plurality of first peaks, the number of first peaks is less than fifty-six, a height of the first peak is from 2% to 4% of the outer diameter of the circular ceramic body, an average diameter of the primary ring is from 15% to 19% of the outer diameter of the circular body,
two protruding portions extending radially inward from the average diameter of the primary ring, wherein the two protrusions extend more inwardly than the plurality of first peaks, and
a depressed portion, such that the two protruding portions transition to the depressed portion on either side of the depressed portion, wherein at least one of the purge openings is disposed along the average diameter of the primary ring and radially outward from the depressed portion; and
a secondary ring, the secondary ring comprising a second conductive element, wherein the second conductive element comprises a plurality of second peaks, the number of second peaks is less than eighty, the height of the second peak is from 2% to 4% of the outer diameter of the circular ceramic body, an average diameter of the secondary ring is from 22% to 26% of the outer diameter of the circular body.

12. The substrate heater of claim 11, wherein the heater further comprises a plurality of circular exclusion zones, wherein each exclusion zone of the plurality of exclusion zones is disposed about each purge opening, such that the diameter of each exclusion zone is from 3 percent to 5 percent of the outer diameter.

13. The substrate heater of claim 11, wherein the first conductive element further comprises:
a first segment;
a second segment; and
a rounded segment, wherein the rounded segment connects the first segment to the second segment.

14. The substrate heater of claim 11, further comprising a thermal barrier at least partially surrounding the resistive heating element.

15. The substrate heater of claim 11, further comprising a tertiary ring, the tertiary ring comprising a third conductive element, wherein the third conductive element comprises a plurality of third peaks, the number of third peaks is less than eighty, the height of the third peak is 2% to 4% of the outer diameter of the circular ceramic body, the average diameter of the tertiary ring is from 30% to 34% of the outer diameter of the circular body.

16. The substrate heater of claim 11, wherein the heater is disposed over a shaft, and the shaft is configured to raise and lower the heater.

17. The substrate heater of claim 11, wherein the resistive heating element further comprises a thermal barrier, and the thermal barrier surrounds the resistive heating element.

18. The substrate heater of claim 17, wherein the thermal barrier comprises zirconium and oxygen.

19. The substrate heater of claim 11, wherein the heater comprises aluminum and nitride.

* * * * *